United States Patent
Schlack

(10) Patent No.: US 7,172,441 B2
(45) Date of Patent: Feb. 6, 2007

(54) EJECTOR LEVER ASSEMBLY

(75) Inventor: Richard E. Schlack, Rising Sun, MD (US)

(73) Assignee: Southco, Inc., Concordville, PA (US)

( * ) Notice: Subject to any disclaimer, the term of this patent is extended or adjusted under 35 U.S.C. 154(b) by 0 days.

(21) Appl. No.: 11/158,135

(22) Filed: Jun. 21, 2005

(65) Prior Publication Data

US 2005/0282419 A1     Dec. 22, 2005

Related U.S. Application Data

(60) Provisional application No. 60/581,555, filed on Jun. 21, 2004.

(51) Int. Cl.
   *H01R 13/62*     (2006.01)
(52) U.S. Cl. .................. 439/152; 439/157; 361/732; 361/747
(58) Field of Classification Search ............... 439/152, 439/157, 160, 372; 361/732, 747
   See application file for complete search history.

(56) References Cited

U.S. PATENT DOCUMENTS

| | | | |
|---|---|---|---|
| 4,648,009 A * | 3/1987 | Beun et al. ............... 361/740 |
| 4,699,594 A * | 10/1987 | Assel et al. ............... 439/152 |
| 4,740,164 A * | 4/1988 | Schulz et al. ............. 439/157 |
| 4,996,631 A * | 2/1991 | Freehauf .................. 439/157 |
| 5,293,303 A * | 3/1994 | Fletcher et al. .......... 361/730 |
| 5,309,325 A * | 5/1994 | Dreher et al. ............. 361/754 |
| 5,414,594 A * | 5/1995 | Hristake .................. 361/755 |
| 5,577,922 A * | 11/1996 | Enomoto et al. .......... 439/157 |
| 6,147,872 A * | 11/2000 | Roy ......................... 361/732 |
| 6,160,717 A * | 12/2000 | Desousa et al. ........... 361/798 |
| 6,388,884 B1 | 5/2002 | Greco et al. |
| 6,443,315 B1* | 9/2002 | Tabuchi .................... 361/740 |
| 6,494,729 B1* | 12/2002 | Stathopoulos et al. .... 439/160 |
| 6,579,029 B1* | 6/2003 | Sevde et al. ............. 403/322.3 |
| 6,644,991 B2* | 11/2003 | Martin ..................... 439/157 |
| 6,741,479 B2 | 5/2004 | Korber et al. |
| 6,916,190 B2* | 7/2005 | Joist ......................... 439/160 |
| 2004/0049903 A1 | 3/2004 | Koerber et al. |

FOREIGN PATENT DOCUMENTS

| | | |
|---|---|---|
| DE | 299 22 725 U 1 | 3/2001 |
| DE | 200 14 199 7 U 1 | 10/2001 |
| EP | 1 176 858 A2 | 1/2002 |
| EP | 1499171 A1 * | 1/2005 |

OTHER PUBLICATIONS

"Advanced TCA PICMG Specification, Engineering Change Notice 3.0-1.0-001," by the PCI Industrial Computers Manufacturers Group, Dated Jan. 21, 2004, pp. D-1 D-12.
"Advanced TCA PICMG 3.0 Short form Specification," by the PCI Industrial Computers Manufacturers Group, Dated Jan. 2003, p. 7.

* cited by examiner

Primary Examiner—Briggitte R. Hammond
(74) Attorney, Agent, or Firm—Paul & Paul

(57) ABSTRACT

A lever assembly used for ejecting a circuit board or other plug-in type component from a chassis or sub-rack is disclosed. The lever assembly includes a sliding catch supported by at least a portion of the lever for rectilinear motion in a direction along the portion of the lever. The sliding catch has a catch hook adapted to engage a portion of the circuit board or other plug-in type component to retain the lever assembly in a folded-down position.

16 Claims, 8 Drawing Sheets

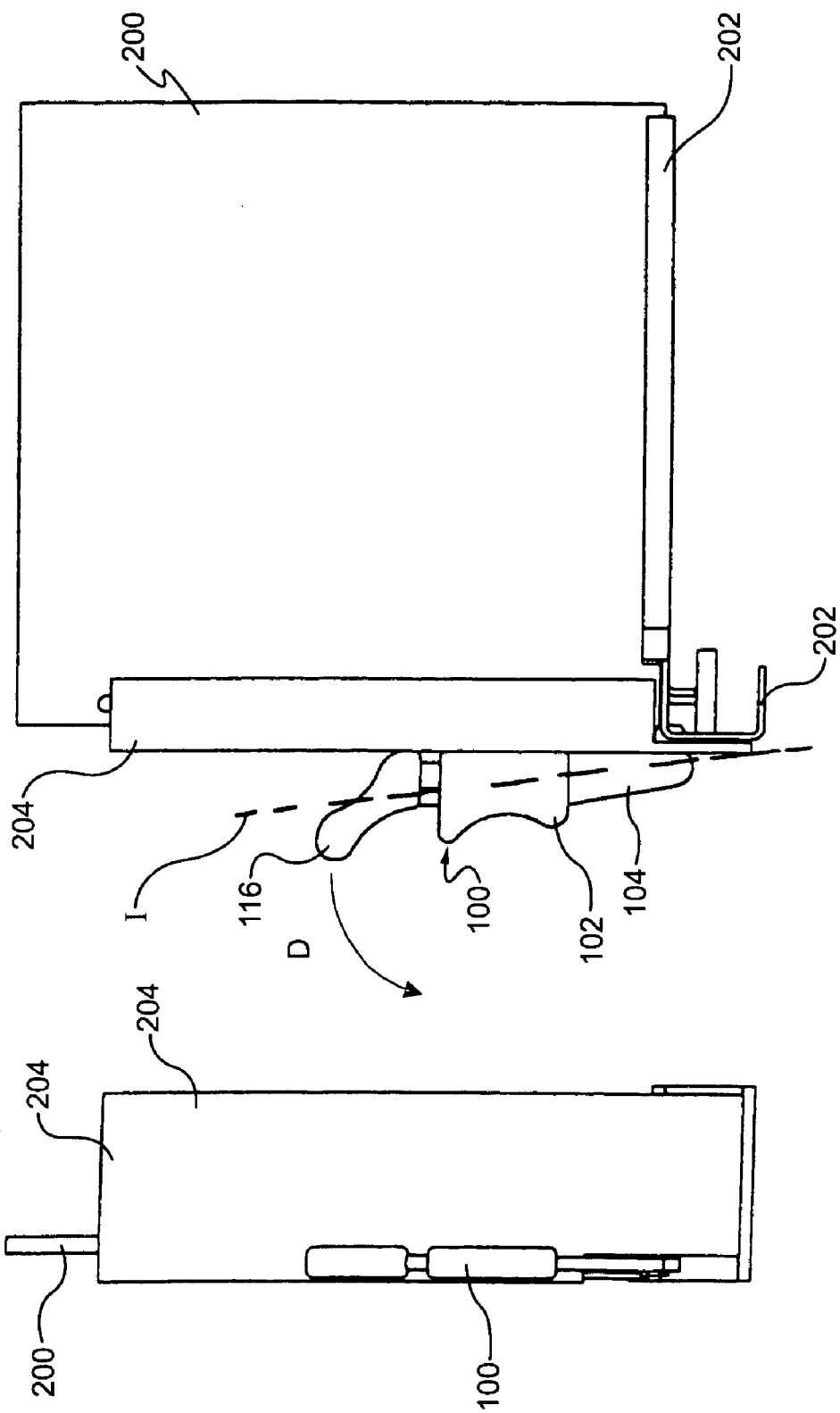

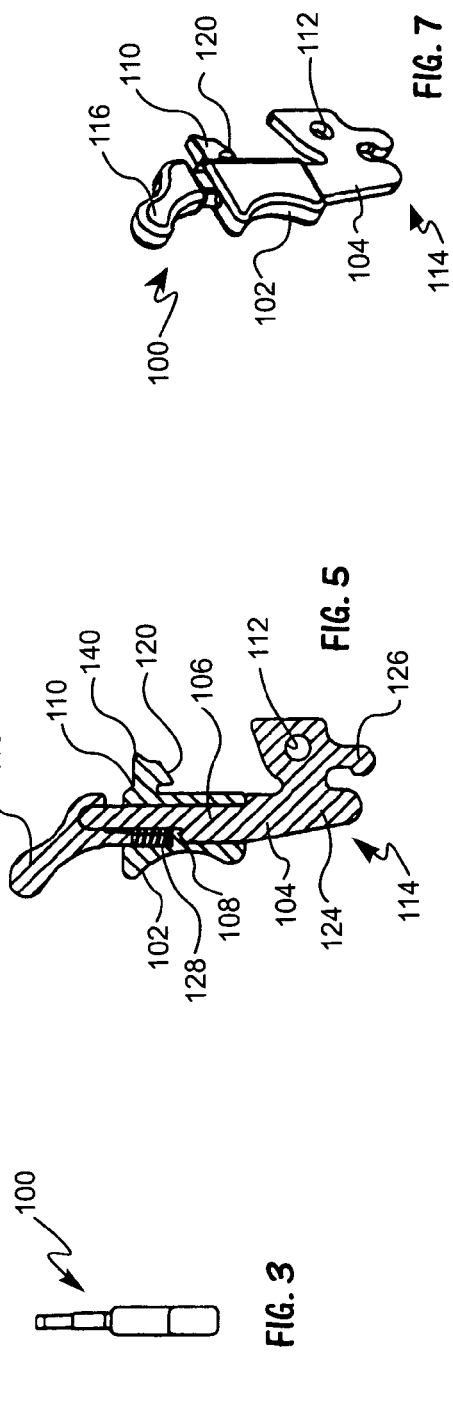
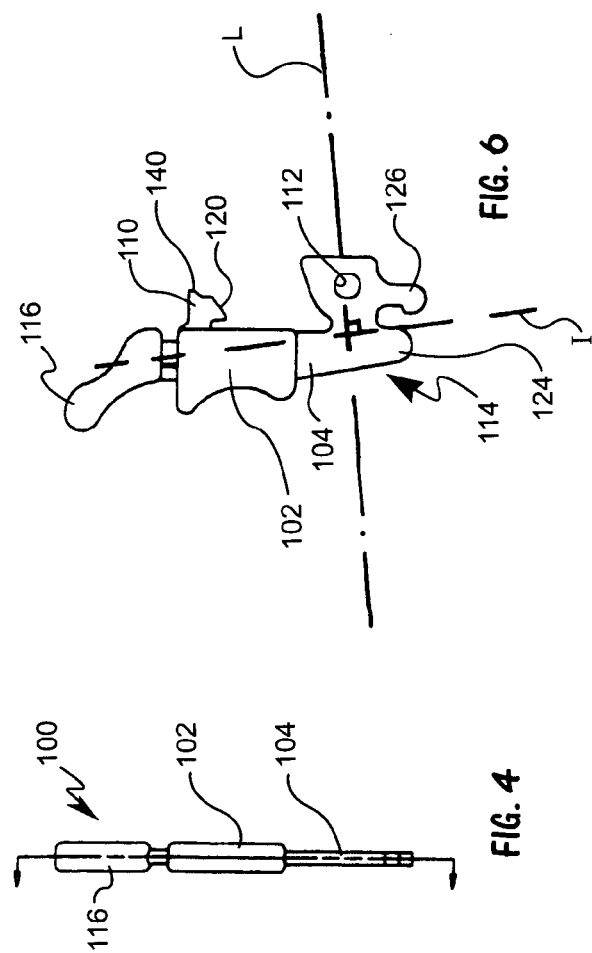

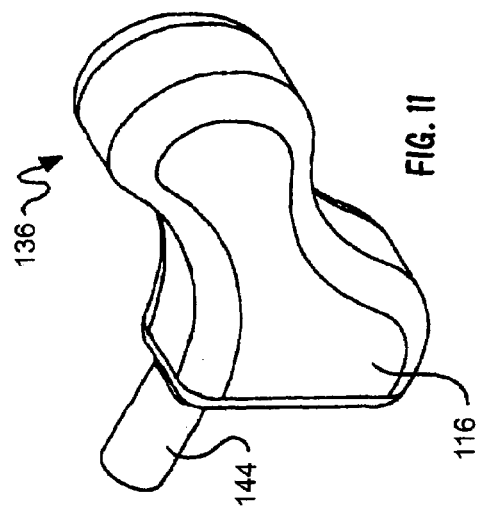
FIG. 11
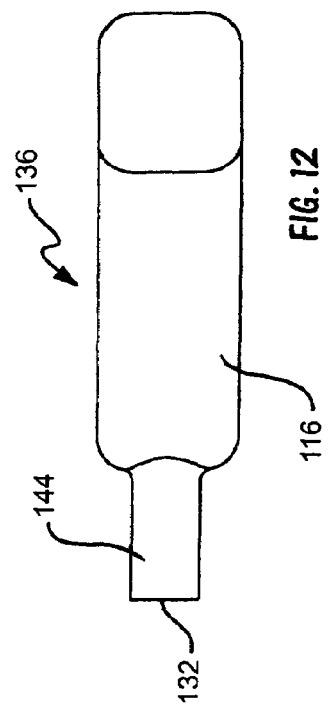
FIG. 12
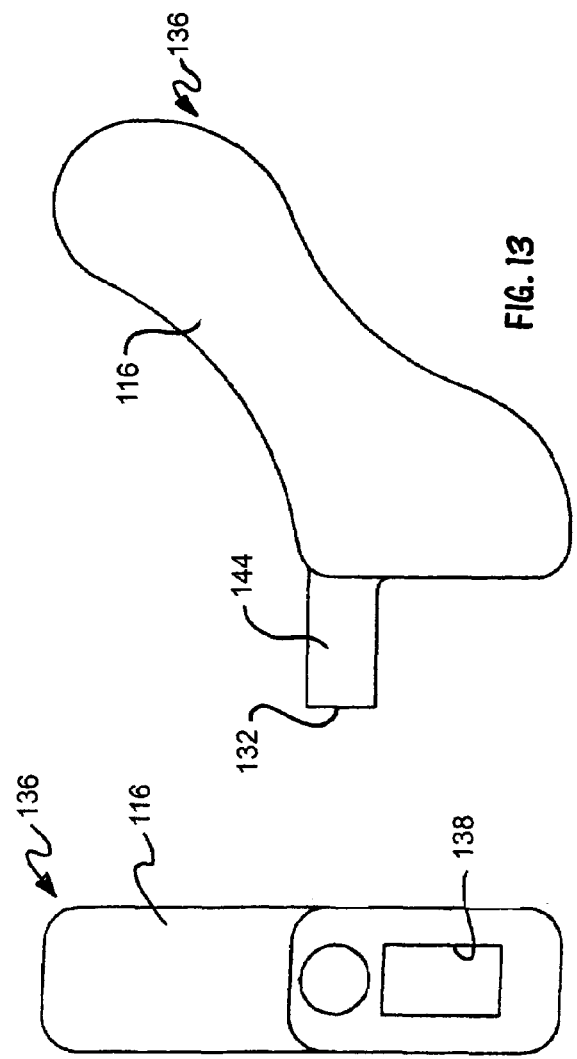
FIG. 13
FIG. 14
FIG. 15

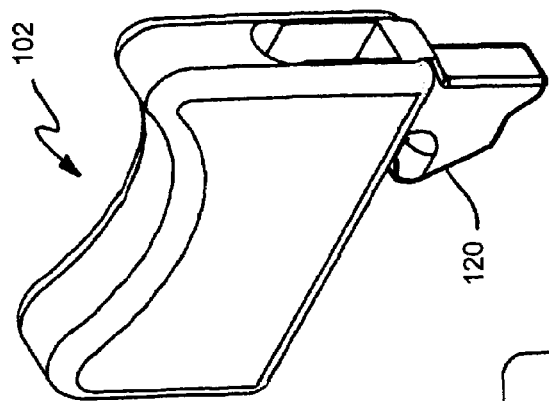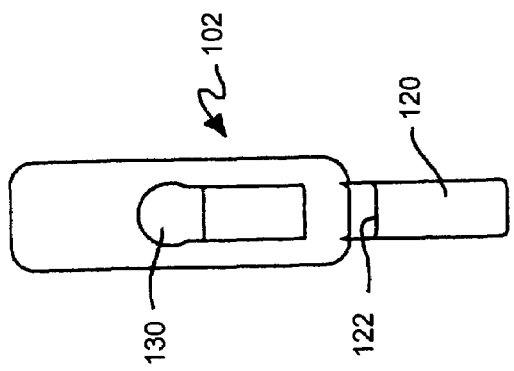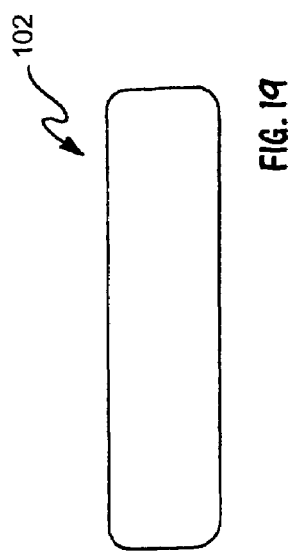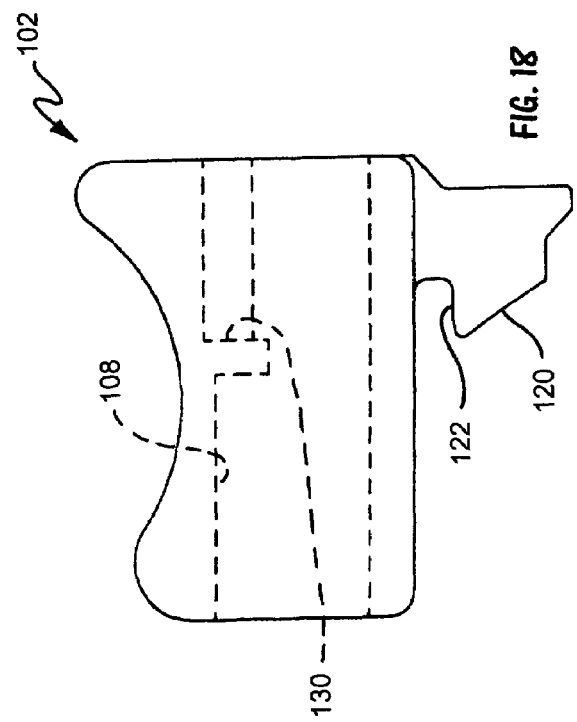

EJECTOR LEVER ASSEMBLY

CROSS REFERRENCE TO RELATED APPLICATIONS

This application claims the benefit of the priority of U.S. Provisional Patent Application Ser. No. 60/581,555, filed on Jun. 21, 2004, the entire disclosure of which is incorporated herein by reference.

BACKGROUND OF THE INVENTION

1. Field of Invention

The present invention relates to the field of ejector lever assemblies used for ejecting a circuit board or other plug-in type component from a chassis or sub-rack.

2. Brief Description of the Related Art

Ejector lever assemblies used for ejecting a circuit board or other plug-in type component from a chassis or sub-rack are known in the prior art but non-provide the advantages of the present invention as will be apparent from the description and claims below.

SUMMARY OF THE INVENTION

The present invention is directed to a lever assembly used for ejecting a circuit board or other plug-in type component from a chassis or sub-rack. The lever assembly includes a sliding catch supported by at least a portion of the lever for rectilinear motion in a direction along the portion of the lever. The sliding catch has a catch hook adapted to engage a portion of the circuit board or other plug-in type component to retain the lever assembly in a folded-down position.

BRIEF DESCRIPTION OF THE DRAWINGS

FIGS. 1 and 2 are environmental views showing the lever assembly of the present invention installed to an electronic module plugged into a support structure.

FIGS. 3–7 are views showing the lever assembly of the present invention in various orientations and in cross section.

FIGS. 11–15 are views showing the second lever portion of the lever assembly of the present invention.

FIGS. 16–19 are views showing the sliding catch of the lever assembly of the present invention.

DETAILED DESCRIPTION OF THE INVENTION

Figure 8:
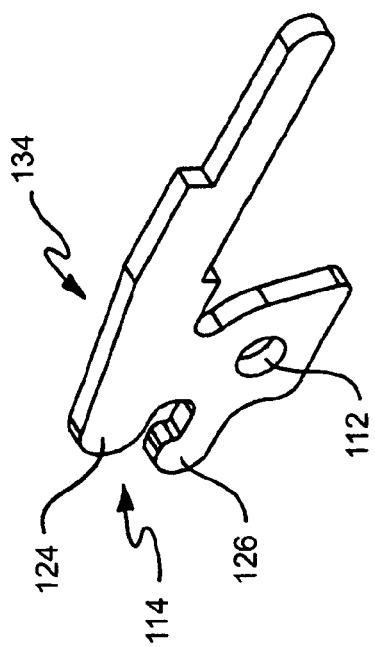
FIGS. 8–10 are views showing the first lever portion of the lever assembly of the present invention.
Figure 9:
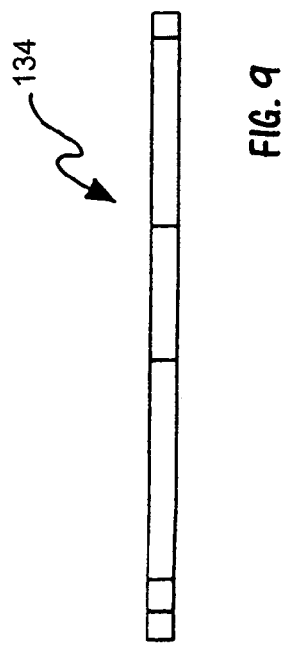
Figure 10:
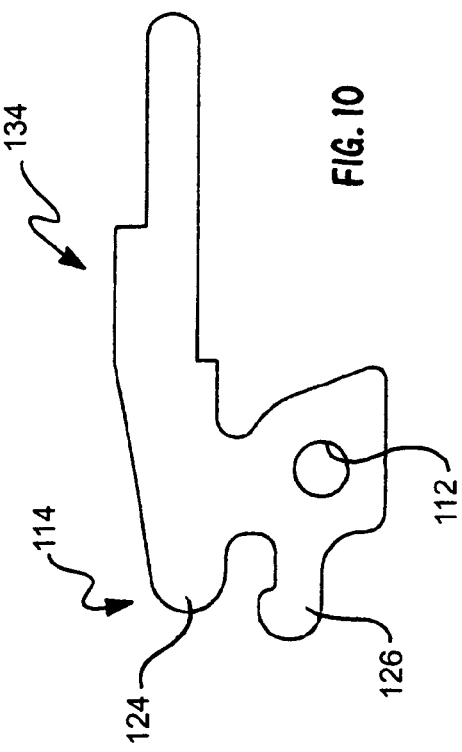
Figure 24:
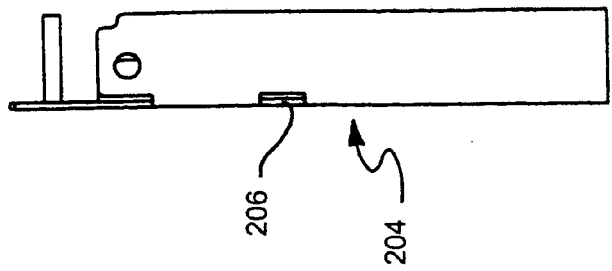
FIGS. 20–24 are views showing the faceplate of the electronic module that uses the present invention.
Figure 22:
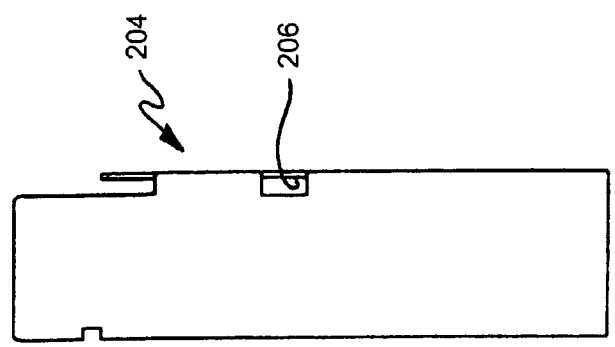
Figure 23:
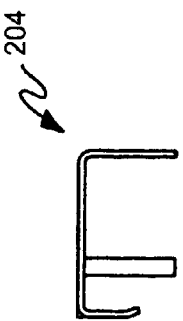
Figure 21:
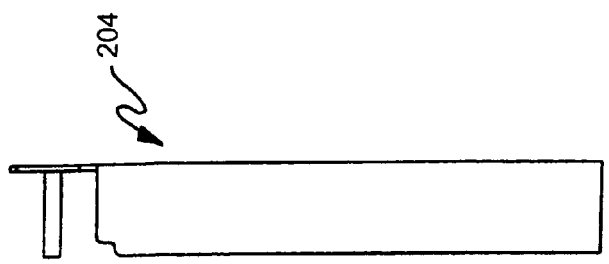
Figure 20:
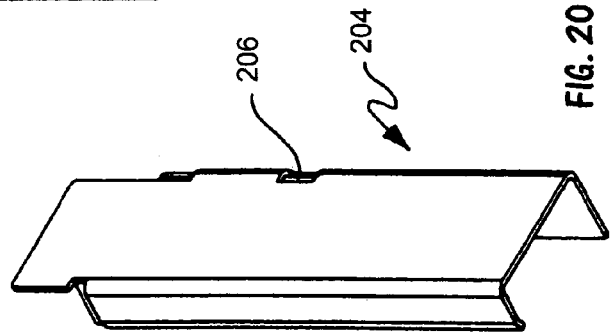

The present invention is directed to a lever assembly 100 used for ejecting an electronic module 200 such as a circuit board or other plug-in type component from a chassis or sub-rack 202. The lever assembly 100 includes a sliding catch 102 supported by at least a portion 106 of the lever 104 for rectilinear motion in a direction along the portion 106 of the lever 104 in such a way that at least a portion of the lever portion 106 is positioned within a channel 108 formed in the sliding catch 102 at all times during the operation of the sliding catch 102 over its range of rectilinear motion. The sliding catch 102 has a catch hook 110 adapted to engage a portion of the circuit board or other plug-in type component 200 to retain the lever assembly 100 in a folded-down position as illustrated in FIG. 1.

The ejector lever assembly 100 includes a lever 104 and a sliding catch 102. The lever 104 has a hole 112 for pivotal connection to the electronic module 200. The lever 104 having an engaging portion 114 adapted for engaging a portion of the support structure 202 and a grasping portion 116 adapted for allowing manual pivotal movement of said lever by a user. The hole 112 defines an axis of rotation for the lever 104 upon pivotal connection of the lever to the electronic module by a pivot pin 118. The axis of rotation is fixed in position relative to the electronic module 200 during operation of the lever 104. The lever 104 is pivotally movable between a folded-down position and a raised position when the lever 104 is installed on the electronic module 200. The axis of rotation of the lever is positioned intermediate the grasping portion 116 and the engaging portion 114 in the sense that the axis of rotation of the lever 104 is positioned relative to the grasping portion 116 and the engaging portion 114 such that when the lever 104 is in the folded-down position with the engaging portion 114 engaging the support structure 202 a line L passing through the axis of rotation and being perpendicular to an imaginary axis I, defined by a point on the grasping portion and a contact point between the engaging portion and the support structure, intersects the imaginary axis I intermediate the grasping portion 116 and the engaging portion 114. The grasping portion 116 is located at a greater distance from a position where the line L intersects the imaginary axis I as compared to the engaging portion 114 to thereby provide a mechanical advantage for the user.

The sliding catch 102 is supported by at least a portion 106 of the lever 104 for rectilinear motion in a direction along the at least a portion 106 of the lever 104. The sliding catch 102 has a catch hook 110 adapted to engage a portion of the electronic module 200 known as the face plate 204 and retain the lever 104 in the folded-down position when the sliding catch 102 is in a first position. The catch hook 110 has beveled surface 120 that interacts with the faceplate 204 to automatically move the catch 102 out of the first or engaged position as the lever 104 is moved to the folded-down position. Adjacent the beveled surface 120 is a catch surface 122 that engages the underside of the face plate 204 to retain the lever 104 in the folded-down position when the sliding catch 102 is in the first position.

When the electronic module 200 is plugged in to the support structure 202 a user can move the sliding catch 102 to a second position out of engagement with the electronic module 200 and then lift the lever 104 toward the raised position as indicated by the arrow D to thereby move the electronic module 200 toward an unplugged position aided by the mechanical advantage provided by the lever 104.

The grasping portion 116 extends away from the electronic module 200 when the lever 104 is in the folded-down position such that a user can place at least a portion of a finger under the grasping portion 116 to thereby aid the user in lifting the lever 104 toward the raised position.

The engaging portion 114 is bifurcated and has an upper branch 124 and a lower branch 126 wherein a portion of the support structure 202 is received between the upper branch and the lower branch. The upper branch 124 engages the portion of the support structure 202 as the lever 104 is lifted toward the raised position to thereby move the electronic module 200 toward the unplugged position. The lower branch 126 engages the portion of the support structure 202 as the lever 104 is pivotally moved toward the folded-down position to thereby move the electronic module 200 toward a plugged-in position.

The sliding catch 102 has a channel 108 extending therethrough that is open at both ends. The at least a portion 106 of the lever 104 extends through the channel 108 to thereby support the sliding catch 102 for rectilinear motion in a direction along the at least a portion 106 of the lever 104.

The ejector lever assembly 100 further includes biasing means, wherein the biasing means biases the sliding catch toward the first position. The biasing means is a spring 128 in the illustrated example. The sliding catch 102 has a stop 130 positioned within the channel 108. The lever 104 has a stop 132, and the spring 128 is positioned intermediate the stop 132 of the lever and the stop 130 of the sliding catch 102. The stop 130 of the sliding catch is positioned intermediate the engaging portion 114 and the stop 132 of the lever 104. The stop 132 of the lever 104 is formed by a portion of the grasping portion 116.

The lever 104 of the illustrated embodiment 100 is of two-piece construction and includes a first lever portion 134 and a second lever portion 136. The first lever portion 134 includes the engaging portion 114 and the second lever portion 136 includes the grasping portion 116. One of the first lever portion 134 and the second lever portion 136 is placed at least in part within the channel 108 of the sliding catch 102 before the first lever portion 134 and the second lever portion 136 are attached together to thereby capture the sliding catch 102 on the lever 104. In the attachment process a portion of the lever portion 106 is inserted into a cavity 138 in the second lever portion 136.

Figure 26:
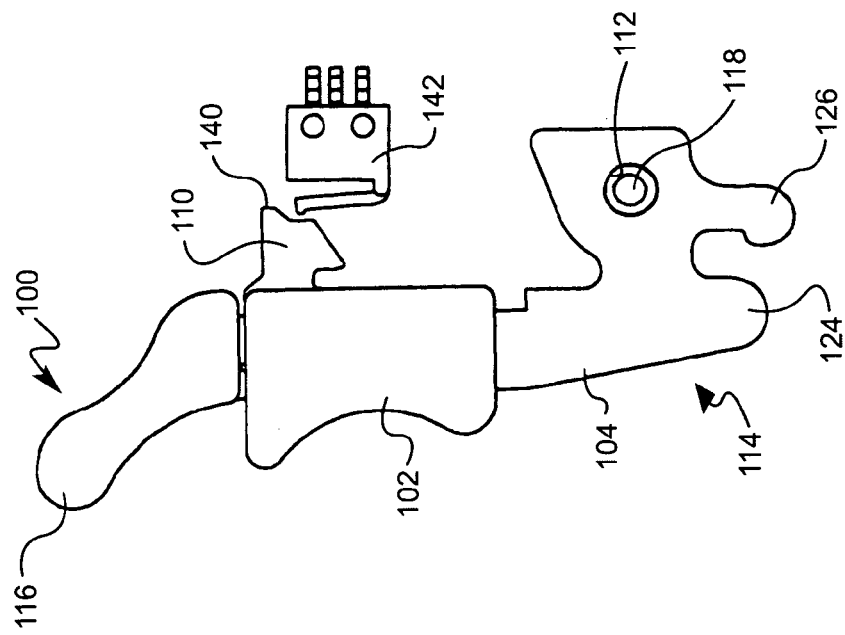
FIGS. 25–26 are environmental views showing the lever assembly of the present invention in relation to the microswitch of the electronic module.
Figure 25:
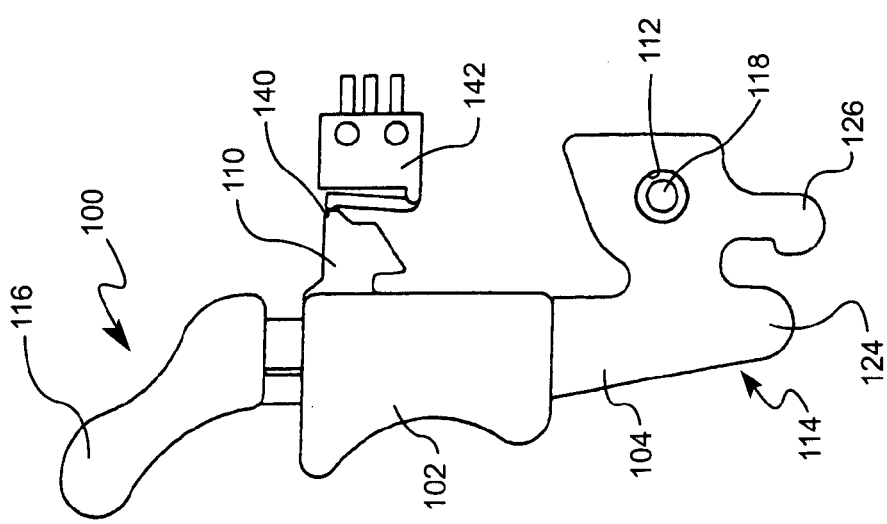
Figure 27:
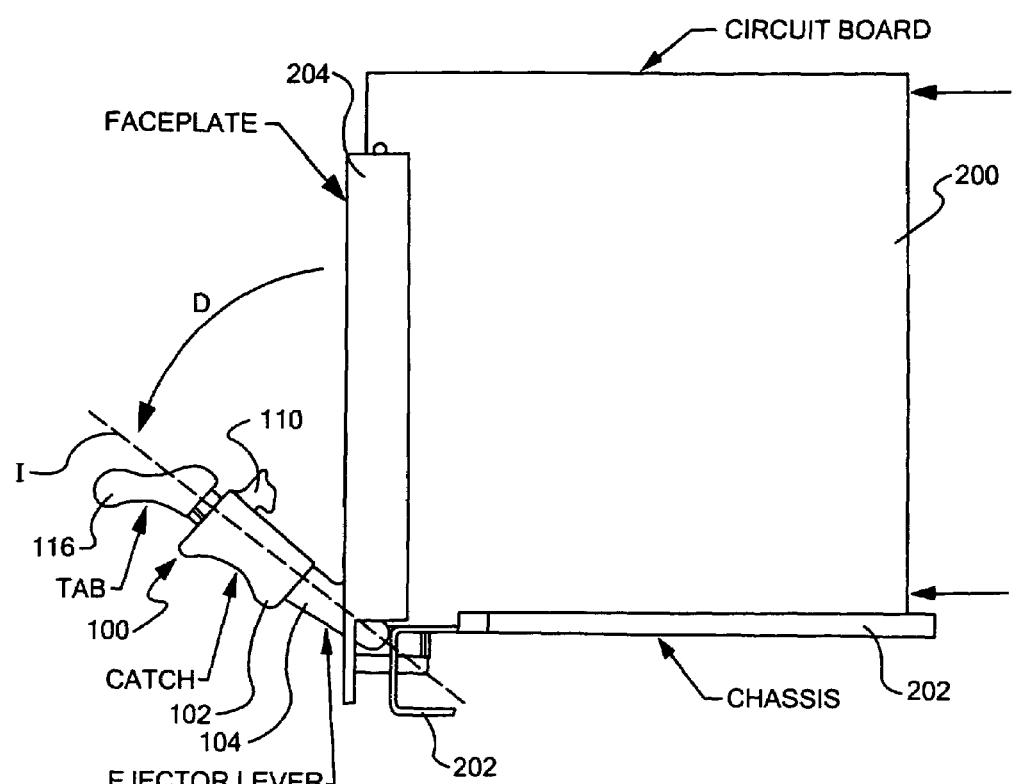
FIG. 27 is an environmental view showing the lever assembly of the present invention in a raised position relative to an electronic module.

The sliding catch 102 is moved toward the grasping portion 116 in order to move the sliding catch 102 from the first position toward the second position. Accordingly, the sliding catch 102 is closer to the grasping portion 116 in the second position illustrated in FIG. 26 than it is in the first position illustrated in FIG. 25.

The catch hook 110 has a projection 140 that operates a microswitch 142 supported by the electronic module 200. The microswitch 142 providing a signal indicative of the position of the sliding catch 102.

As the lever assembly 100 is used to inject or plug in the card 200, the catch 102 slides back through the slot 206 in the faceplate 204 and is spring loaded to automatically catch in place. The projection 140 of the catch hook 110 operates the microswitch 142. As the catch 102 is slid to the open or second position, the microswitch 142 is released before the hook clears the slot 206 in the faceplate 204, assuring that the lever open signal has time to be processed before the card 200 is ejected unplugged.

The lever portion 134 is steel, with a protective coating. The catch 102 and lever portion 136 are plastic. There is a stainless steel compression spring 128 to bias the catch 102 toward the engaging portion 114 of the lever 104. To assemble the lever assembly 100, the catch 102 is slid over the portion 106 of the first lever portion 134, the compression spring 128 is placed in the catch 102, and the second lever portion 136 is pressed onto the end of the first lever portion 134. There is a post 144 on the grasping portion 116 that forms part of the second lever portion 136 and which compresses the spring 128 completely into the catch 102 so it is not visible during use.

The lever assembly of the present invention may use friction (e.g. from a spring washer) or a torsion spring to hold it the raised position.

The advantages of the embodiment 100 prior art include a much more positive locking feature than the "ball and socket" proposed in the prior art. It also allows a more controlled release of the microswitch 142, so that the "latch open" signal from the microswitch has more time to be processed before the board 200 is ejected. In the prior art the lever has a catch that must be operated for both raising and folding down the lever. Prior art levers are not ergonomically friendly and require some very thin slots to be cut in the faceplate 204, which is difficult to control. The present invention allows the microswitch to be located in a more desirable position compared to some prior art levers.

The invention claimed is:

1. An ejector lever assembly for ejecting an electronic module from a supporting structure, the ejector assembly comprising:

a lever having a hole for pivotal connection to the electronic module, said lever having an engaging portion adapted for engaging a portion of the support structure and a grasping portion adapted for allowing manual pivotal movement of said lever by a user, said hole defining an axis of rotation for said lever upon pivotal connection of said lever to the electronic module, said axis of rotation being fixed in position relative to the electronic module during operation of said lever, said lever being pivotally movable between a folded-down position and a raised position when said lever is installed on the electronic module, said axis of rotation of said lever being positioned relative to said grasping portion and said engaging portion such that when said lever is in said folded-down position with said engaging portion engaging the support structure a line passing through said axis of rotation and being perpendicular to an imaginary axis, defined by a point on said grasping portion and a contact point between said engaging portion and the support structure, intersects the imaginary axis intermediate said grasping portion and said engaging portion, said grasping portion being located at a greater distance from a position where the line intersects the imaginary axis as compared to said engaging portion to thereby provide a mechanical advantage for the user;

a sliding catch supported by at least a portion of said lever for rectilinear motion in a direction along said at least a portion of said lever, said sliding catch being movable between a first position and a second position, and said sliding catch having a catch hook adapted to engage a portion of said electronic module and retain said lever in said folded down position when said sliding catch is in said first position; and biasing means, said biasing means biasing said sliding catch toward said first position, whereby when the electronic module is plugged in to the support structure a user can move the sliding catch to said second position out of engagement with the electronic module and then lift said lever toward said raised position to thereby move the electronic module toward an unplugged position aided by said mechanical advantage provided by said lever.

2. The ejector lever assembly according to claim 1, wherein said sliding catch is closer to said grasping portion in said second position than it is in said first position.

3. The ejector lever assembly according to claim 1, wherein said engaging portion is bifurcated and has an upper branch and a lower branch wherein a portion of the support structure is received between said upper branch and said lower branch, said upper branch engages the portion of the support structure as said lever is lifted toward said raised position to thereby move the electronic module toward the unplugged position, and said lower branch engages the portion of the support structure as said lever is pivotally moved toward said folded-down position to thereby move the electronic module toward a plugged-in position.

4. The ejector lever assembly according to claim 1, wherein said sliding catch has a channel extending therethrough that is open at both ends, and said at least a portion of said lever extends through said channel to thereby support said sliding catch for rectilinear motion in a direction along said at least a portion of said lever.

5. The ejector lever assembly according to claim 1, wherein said lever is of two-piece construction and includes a first lever portion and a second lever portion, said first lever portion including said engaging portion and said second lever portion including said grasping portion, one of said first lever portion and said second lever portion being placed at least in part within said channel of said sliding catch before said first lever portion and said second lever portion are attached together to thereby capture said sliding catch on said lever.

6. The ejector lever assembly according to claim 1, wherein said catch hook has a projection that operates a microswitch supported by the electronic module, the microswitch providing a signal indicative of the position of the sliding catch.

7. The ejector lever assembly according to claim 1, wherein said grasping portion extends away from the electronic module when said lever is in said folded-down position such that a user can place at least a portion of a finger under said grasping portion to thereby aid the user in lifting said lever toward said raised position.

8. The ejector lever assembly according to claim 7, wherein said engaging portion is bifurcated and has an upper branch and a lower branch wherein a portion of the support structure is received between said upper branch and said lower branch, said upper branch engages the portion of the support structure as said lever is lifted toward said raised position to thereby move the electronic module toward the unplugged position, and said lower branch engages the portion of the support structure as said lever is pivotally moved toward said folded-down position to thereby move the electronic module toward a plugged-in position.

9. The ejector lever assembly according to claim 8, wherein said sliding catch has a channel extending therethrough that is open at both ends, and said at least a portion of said lever extends through said channel to thereby support said sliding catch for rectilinear motion in a direction along said at least a portion of said lever.

10. The ejector lever assembly according to claim 9, wherein said biasing means is a spring, said sliding catch has a stop positioned within said channel, said lever has a stop, and said spring is positioned intermediate said stop of said lever and said stop of said sliding catch.

11. The ejector lever assembly according to claim 10, wherein said stop of said sliding catch is positioned intermediate said engaging portion and said stop of said lever.

12. The ejector lever assembly according to claim 11, wherein said stop of said lever is formed by a portion of said grasping portion.

13. The ejector lever assembly according to claim 12, wherein said lever is of two-piece construction and includes a first lever portion and a second lever portion, said first lever portion including said engaging portion and said second lever portion including said grasping portion, one of said first lever portion and said second lever portion being placed at least in part within said channel of said sliding catch before said first lever portion and said second lever portion are attached together to thereby capture said sliding catch on said lever.

14. The ejector lever assembly according to claim 1, wherein said biasing means is a spring, said sliding catch has a stop positioned within said channel, said lever has a stop, and said spring is positioned intermediate said stop of said lever and said stop of said sliding catch.

15. The ejector lever assembly according to claim 14, wherein said stop of said sliding catch is positioned intermediate said engaging portion and said stop of said lever.

16. The ejector lever assembly according to claim 15, wherein said stop of said lever is formed by a portion of said grasping portion.

\* \* \* \* \*